United States Patent [19]

Ishihara

[11] Patent Number: 5,270,229
[45] Date of Patent: Dec. 14, 1993

[54] THIN FILM SEMICONDUCTOR DEVICE AND PROCESS FOR PRODUCING THEREOF

[75] Inventor: Shin-ichiro Ishihara, Takatsuki, Japan

[73] Assignee: Matsushita Electric Industrial Co., Ltd., Osaka, Japan

[21] Appl. No.: 874,214

[22] Filed: Apr. 27, 1992

Related U.S. Application Data

[63] Continuation of Ser. No. 482,984, Feb. 22, 1990, abandoned.

[30] Foreign Application Priority Data

Mar. 7, 1989 [JP] Japan ................. 1-054025

[51] Int. Cl.$^5$ ................. H01L 21/336; H01L 21/283; H01L 27/12
[52] U.S. Cl. ................. 437/40; 437/101; 205/102; 205/103; 205/106; 205/333; 205/915
[58] Field of Search ................. 437/2, 40, 41, 101, 437/230, 233, 21; 205/102, 103, 106, 107, 234, 235, 333, 915

[56] References Cited

U.S. PATENT DOCUMENTS

| | | | |
|---|---|---|---|
| 3,577,326 | 5/1971 | Liebschutz | 205/102 |
| 3,627,647 | 12/1971 | Reuter et al. | 205/333 |
| 3,714,633 | 1/1973 | Epstein et al. | 437/141 |
| 3,770,594 | 11/1973 | Mentone | 205/102 |
| 3,802,854 | 4/1974 | Mueller-Dittmann et al. | 205/103 |
| 3,807,037 | 4/1974 | Fischer | 437/203 |
| 3,959,088 | 5/1976 | Sullivan | 204/DIG. 9 |
| 3,990,953 | 11/1976 | Austin | 204/58.5 |
| 4,040,073 | 8/1977 | Luo | 357/23.7 |
| 4,082,626 | 4/1978 | Hradcovsky | 205/106 |
| 4,086,101 | 4/1978 | Jordan et al. | 437/230 |
| 4,113,578 | 9/1978 | Del Monte | 437/230 |
| 4,140,596 | 2/1979 | Wöbking | 205/103 |
| 4,145,262 | 3/1979 | Tijburg et al. | 205/333 |
| 4,167,805 | 9/1979 | Castel | 437/230 |
| 4,192,720 | 3/1980 | Bucker et al. | 204/37.1 |
| 4,204,933 | 5/1980 | Barlow et al. | 204/181.5 |
| 4,208,254 | 6/1980 | Mitsumoto et al. | 205/103 |
| 4,248,675 | 2/1981 | Bozler et al. | 205/333 |
| 4,335,161 | 6/1982 | Luo | 437/205 |
| 4,425,572 | 1/1984 | Takafuji et al. | 357/23.7 |
| 4,496,436 | 1/1985 | Inoue | 205/103 |
| 4,581,108 | 4/1986 | Kapur et al. | 204/37.1 |
| 4,704,559 | 11/1987 | Suginoya et al. | 204/42 |
| 4,759,610 | 7/1988 | Yanagisawa | 357/23.7 |
| 4,764,261 | 8/1988 | Ondris et al. | 205/915 |
| 4,773,973 | 9/1988 | Grüniger et al. | 205/915 |
| 4,778,560 | 10/1988 | Takeda et al. | 437/58 |
| 4,816,120 | 3/1989 | Ondris et al. | 205/915 |
| 4,931,561 | 6/1990 | Fukaya et al. | 250/208.1 |

FOREIGN PATENT DOCUMENTS

| | | | |
|---|---|---|---|
| 0151673 | 10/1981 | Fed. Rep. of Germany | 437/230 |
| 3034175 | 4/1982 | Fed. Rep. of Germany | 437/230 |
| 2529713 | 1/1984 | France | 437/230 |
| 0041174 | 4/1978 | Japan | 437/230 |
| 006674 | 5/1979 | Japan | 437/230 |
| 0073173 | 5/1982 | Japan | 437/230 |
| 0090982 | 4/1987 | Japan | 437/230 |
| 0048848 | 3/1988 | Japan | 437/230 |
| 0216378 | 9/1988 | Japan | 357/23.7 |
| 0022066 | 1/1989 | Japan | 357/23.7 |
| 0093172 | 4/1989 | Japan | 357/23.7 |
| 926083 | 5/1982 | U.S.S.R. | 205/333 |

OTHER PUBLICATIONS

Sharma et al., "Electroless Deposition of Semiconductor Films", Thin Solid Films, vol. 60, No. 1, 1979, pp. 55–59.

J. Electrochem. Soc., vol. 128, p. 1221 (1981), Y. Takeda et al., "Cathodic Deposition of Amorphous Silicon from Tetraethylorthosilcate in Organic Solvents".

*Primary Examiner*—Mary Wilczewski
*Attorney, Agent, or Firm*—Stevens, Davis, Miller & Mosher

[57] ABSTRACT

A thin film semiconductor device comprising a semiconductor layer and an electrically conductive thin film which are formed by an alternate current plating method, and a process for producing thereof.

3 Claims, 5 Drawing Sheets

THIN FILM SEMICONDUCTOR DEVICE AND PROCESS FOR PRODUCING THEREOF

This application is a continuation of application Ser. No. 07/482,984, filed Feb. 22, 1990.

BACKGROUND OF THE INVENTION

This invention relates to a thin film semiconductor device that can be produced without using any vacuum apparatus or photolithography, and a process for producing thereof.

Technique for forming TFT (thin film transistor) on a large-area substrate of glass, or the like has been developed, and liquid crystal displays using such TFT as a drive circuit have been commercialized. And, there is desired a process for producing thin film semiconductor devices having good characteristics, TFT in particular, at high yields. A conventional TFT array for a liquid crystal display has been produced by several methods, one example of which will be explained below by reference to drawings.

An ITO film is formed on a glass substrate 22 (vacuum is necessary), the film is selectively etched to form a cumulative capacity electrode 21, and an overcoat 20 of an SiO$_2$ film is formed (mask is necessary) (FIG. 7).

An ITO film is formed (vacuum is necessary), and a pixel electrode 23 is selectively formed (mask is necessary) (FIG. 8).

Again, an overcoat of an SiO$_2$ film is formed to form an electrically conductive film (vacuum is necessary), and a TFT gate electrode 24 is selectively formed (mask is necessary) (FIG. 9).

A gate-insulating film, an i-type semiconductor layer 26 and a TFT protective film 27 are formed (vacuum is necessary) (FIG. 10).

The protective film 27 is retained in a region between a TFT source and a drain (FIG. 11).

A contact hole 28 is made in part of the ITO pixel electrode (mask is necessary) (FIG. 12).

An n-type semiconductor layer 38, which is an ohmic layer, is formed (vacuum is necessary), and it is selectively etched except for its TFT portion (mask is necessary) (FIG. 13).

An electrically conductive layer is formed (vacuum is necessary), and there formed selectively are a source 30, a drain electrode wiring 29, etc., (mask is necessary) (FIG. 14).

In the above steps, seven masks are necessary, and many vacuum apparatus are also necessary.

An discussed above, a large vacuum film-forming apparatus and an aligner for photolithography have been conventionally required to commercialize a large-sized liquid crystal display using, as a drive circuit, TFT formed on a large-area substrate of glass, or the like. The limit in increasing the size of a liquid crystal display is defined by these apparatus.

SUMMARY OF THE INVENTION

This invention achieves a production of a thin film semiconductor device by not using any vacuum film-forming apparatus or any aligner for photolithography, but by using a printing method and a plating method, an alternate current plating method in particular, under atmospheric pressure. When a printing method and a plating method are used to form an electrical conductor, an electrode for a semiconductor can be also produced, and when an alternate current plating method is used, an insulating film is formable. Thus, TFT can be produced under atmospheric pressure.

The insulating film is also produced by insulating the surface of a conductor formed by a printing method or a conductor formed thereon according to anodic oxidation, thermal oxidation, oxygen ion implantation, or the like.

According to this invention, it is possible to produce a thin film semiconductor device under atmospheric pressure by using a printing method and a plating method as described above.

DETAILED DESCRIPTION OF THE INVENTION

Examples

The present invention will be explained hereinbelow by reference to drawings.

The present invention will be explained hereinbelow by using production of TFT (thin film transistor) as one embodiment.

The following embodiment is directed to a process for producing a TFT array using a-Si, produced by a plating method, and a liquid crystal panel driven by it. The FIGS. 1 to 6 show corresponding production steps 1 to 6.

Figure 1:
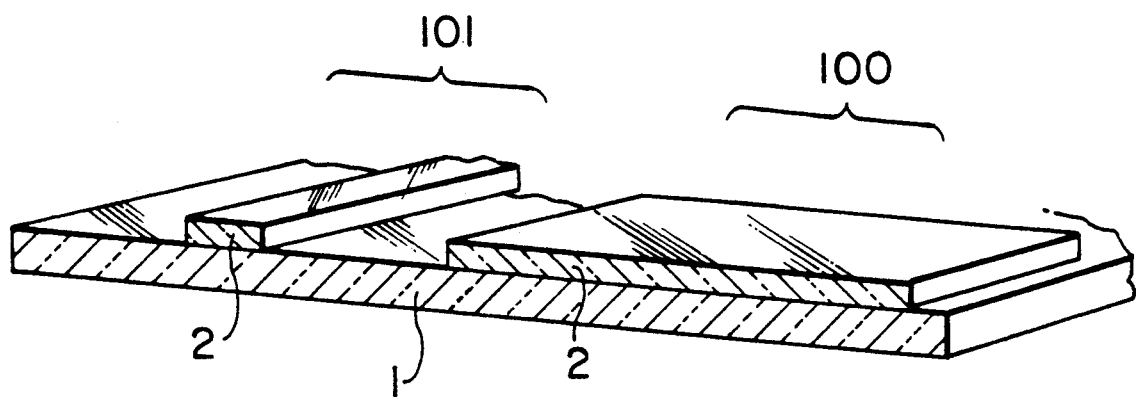
FIGS. 1 to 6 are cross-sectional perspective views showing a stepwise process, as one embodiment of this invention, for the production of TFT and a liquid crystal display panel driven by the TFT
Figure 2:
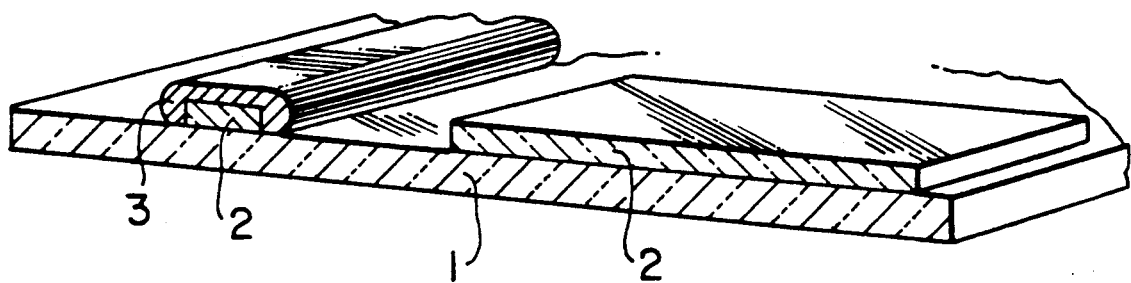
Figure 3:
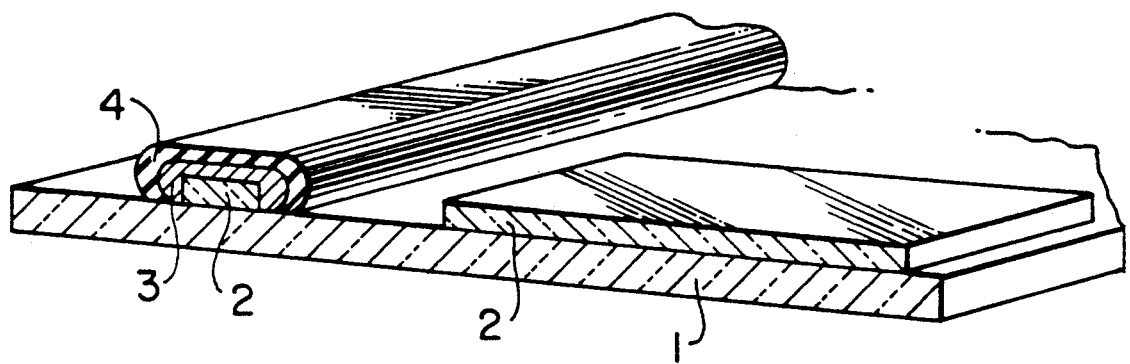

In FIG. 1, a transparent electrically conductive film 2 is formed on a liquid crystal electrode portion 100 and a TFT portion 101 on a glass substrate 1 by a printing method. It was formed by dissolving ITO (oxidation alloy film of indium and tin), an SnO$_2$ powder or a metal powder of indium or tin in a solvent, using the resultant solution for printing, and then carrying out heat treatment. As another method, the clear electrically conductive film 2 was also formed by dissolving SnCl$_4$ in hydrochloric acid, spraying a heated glass substrate 1 with the resultant solution to form SnO$_2$, printing a resist, and selectively etching it. That part of the clear electrically conductive film 2 which is present on the TFT portion 101 is to constitute a gate electrode of TFT, and an electrically conductive film is formed thereon by a plating method so that resistance is decreased. In this embodiment, said part was electroplated with a metallic film 3. (FIG. 2). This electroplating was carried out on each of the transparent electrically conductive films formed by the above two methods. The metallic film 3 could be also formed by a direct current plating method. However, a pulse plating method was able to give a smoother surface to the films. The surface smoothness obtained by an alternate current plating method is far higher than that obtained by a direct current plating method. Since that part of the transparent electrically conductive film 2 which is on the liquid crystal display electrode portion 100 is not electrically connected (or isolated like an island), this part is not plated and the metallic film 3 is not formed thereon.

Then formed on the metallic film 3 was an insulator film 4 (FIG. 3) by an alternate current plating method in which a pulse electric field of 50 Hz to 500 KHz and a high-frequency electric field of 1 MHz to 100 MHz were overlapped. And yet, the insulator film 4 was also formed by anodic oxidation of the metallic film 3 as another method.

Figure 4:
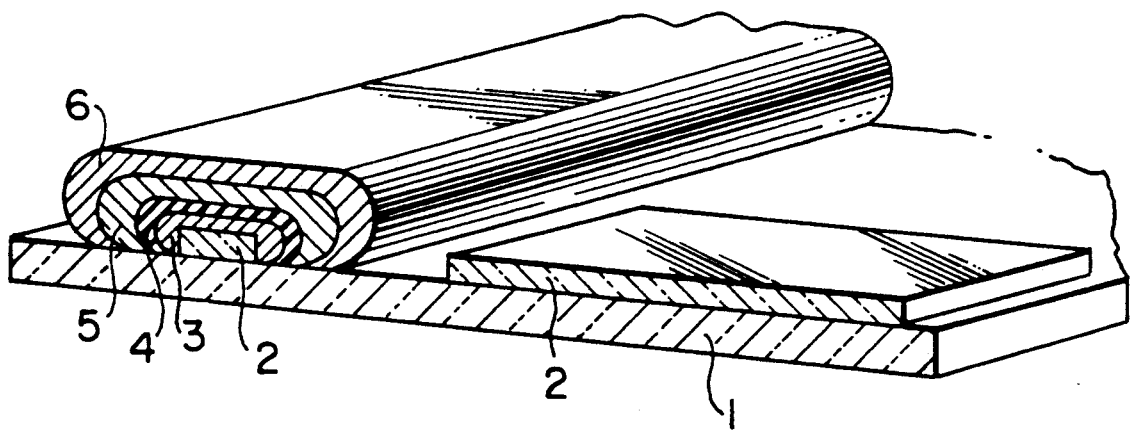

The insulator film 4 formed by the alternate current plating method contained $SiO_2$ as a main component. The plating solution used for the above plating is prepared by dissolving a silicon source such as silicon chloride, silicon fluoride, ethyl silicate, ammonium silicofluoride, $K_2SiF_6$ or $SiHCl_3$ in a non-aqueous organic solvent such as alcohols, ethers, nitriles, amines, amides or the like, acetic acid, or others. In FIG. 4, an i-type semiconductor film 5 is formed on the insulator film 4, and an n-type semiconductor film 6 is formed thereon. The semiconductor films were formed as follows. That is, although the forming conditions differ depending upon an electrolyte and solvent, a Pt plate or a graphite rod was used as an anode, and a Ni plate or a stainless steel plate as a cathode, and these films were electrodeposited by setting the pulse height (voltage) such that the peak current value became 1 to 50 $mA/cm^2$. The electrodeposition rate was about 1 Å/sec to 100 Å/sec. The semiconductor films 5 and 6 were also formed by using the above-mentioned plating liquid in principle, but by changing the alternate current plating conditions. As an n type additive, a phosphorus compound such as triethyl phosphate $[(C_2H_5O)_3PO]$ or an arsenic compound was incorporated into the plating solution. As a p-type additive, triethyl borate $[B(OEt)_3]$ was used.

Figure 5:
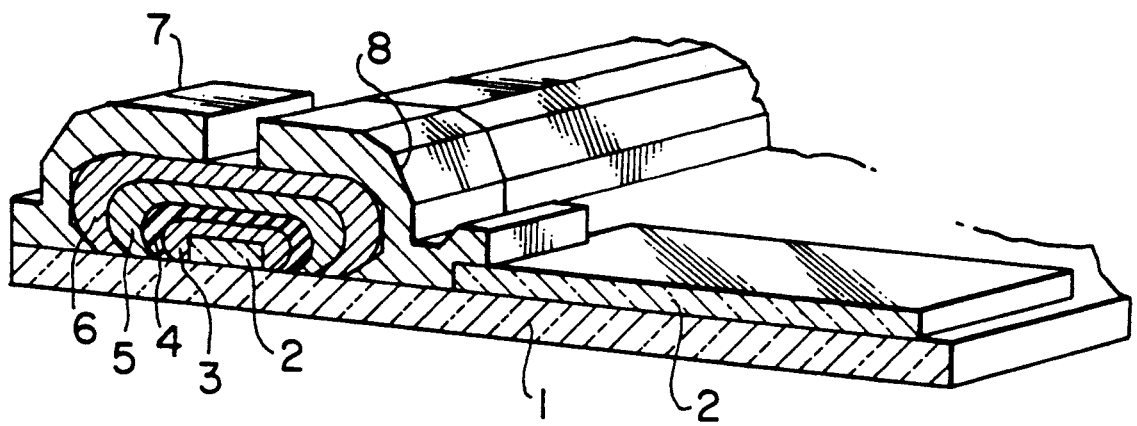

Then, as shown in FIG. 5, a TFT source electrode 7 and a drain electrode 8 were formed by the same printing method as that in the step 1, in which an electrical conductor powder (a metallic powder containing Ag, Cu, or the like) was dispersed in an organic solvent, and the resultant paste was used for the printing (e.g. screen-printing) and heat-treated.

Figure 6:
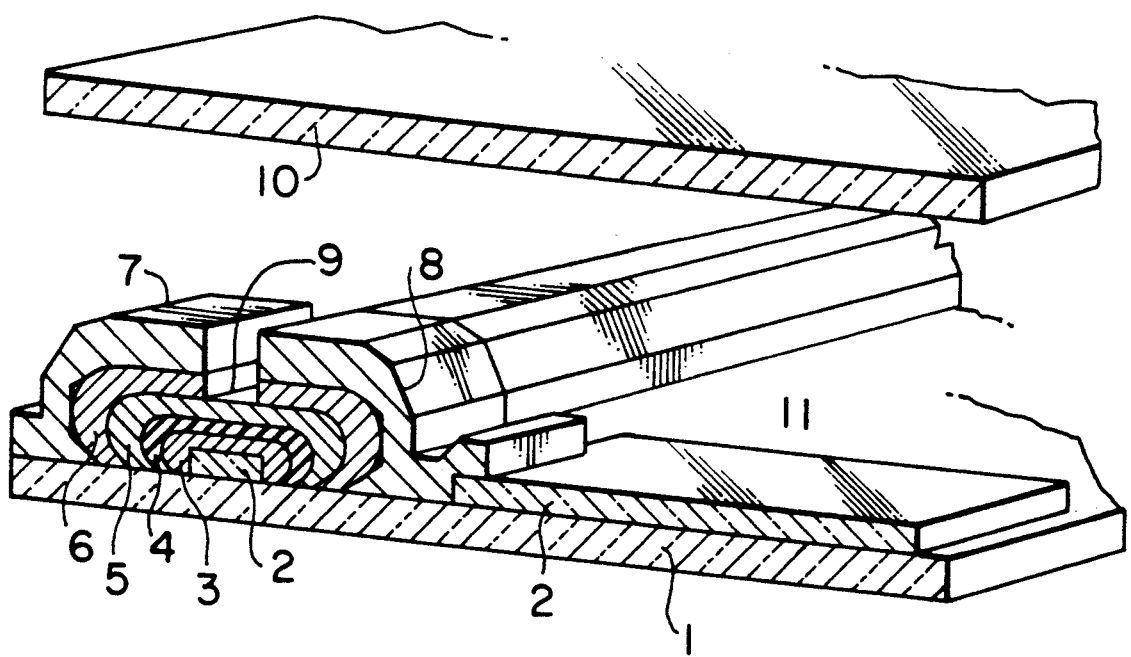
Figure 7:
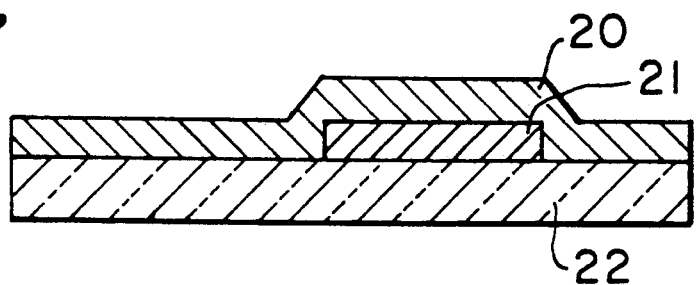
FIGS. 7 to 14 are cross-sectional views showing production steps of a conventional process.
Figure 8:
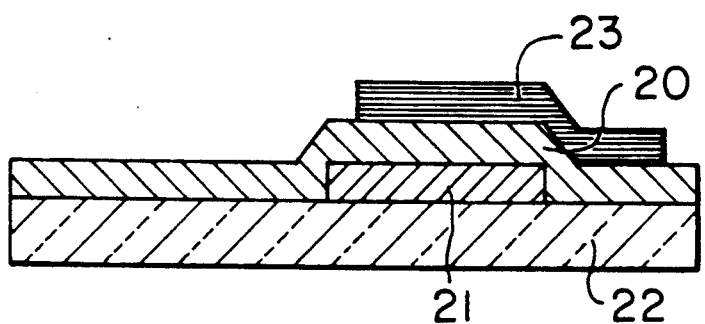
Figure 9:
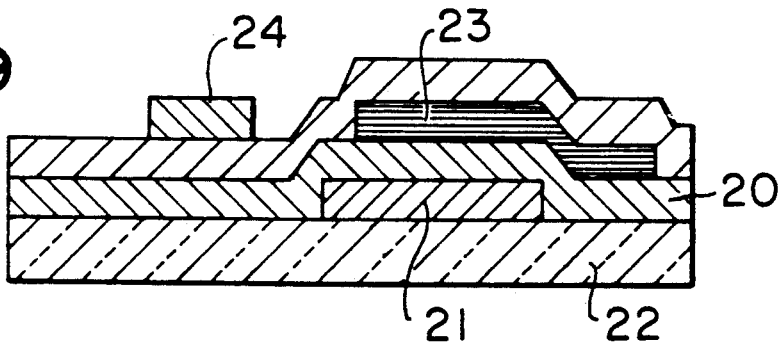
Figure 10:
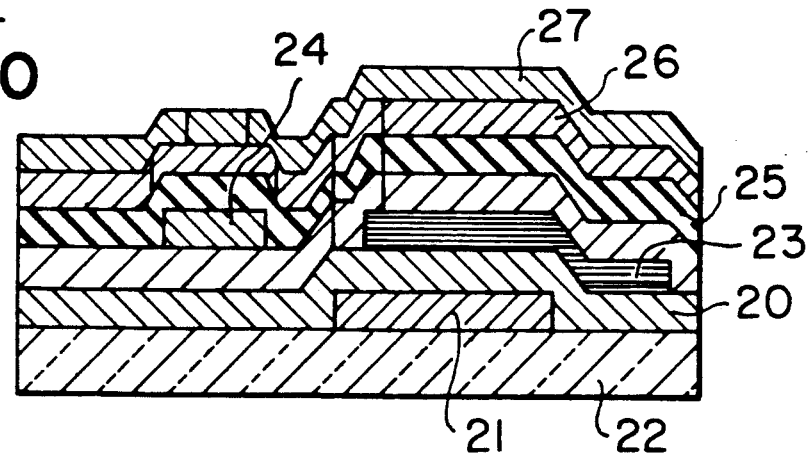
Figure 11:
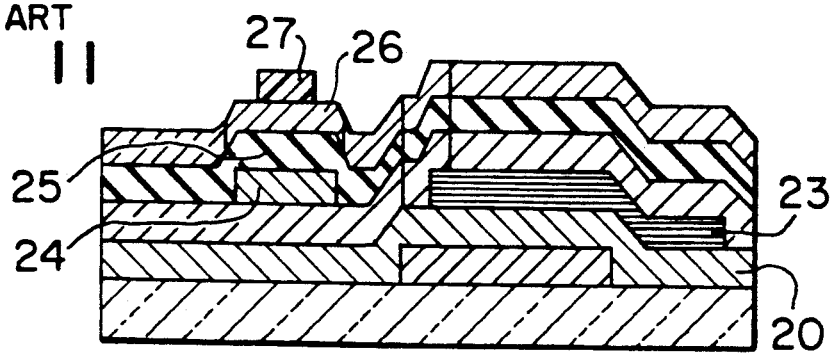
Figure 12:
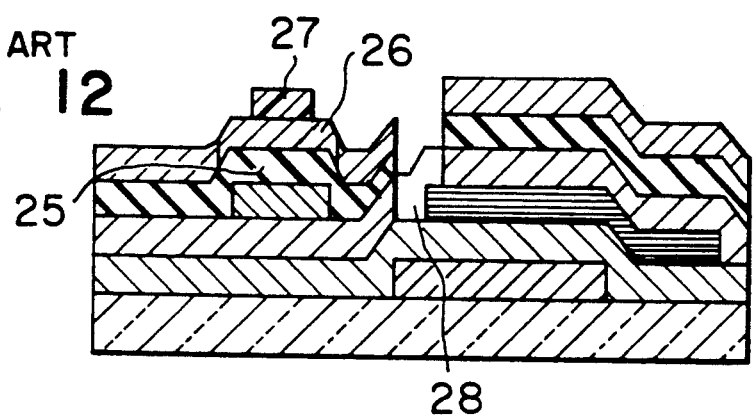
Figure 13:
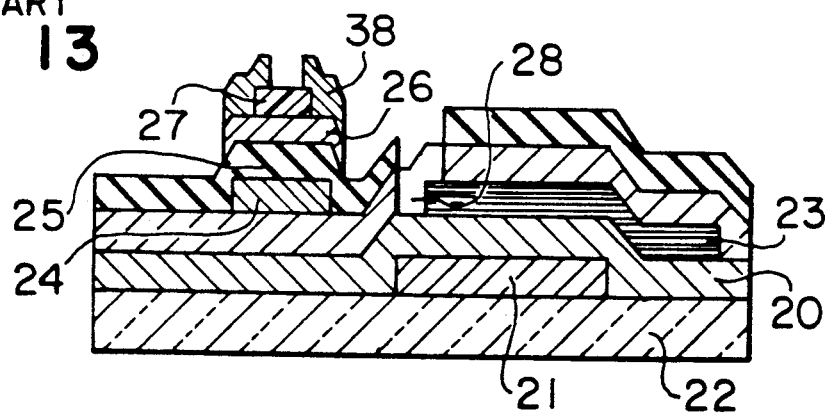
Figure 14:
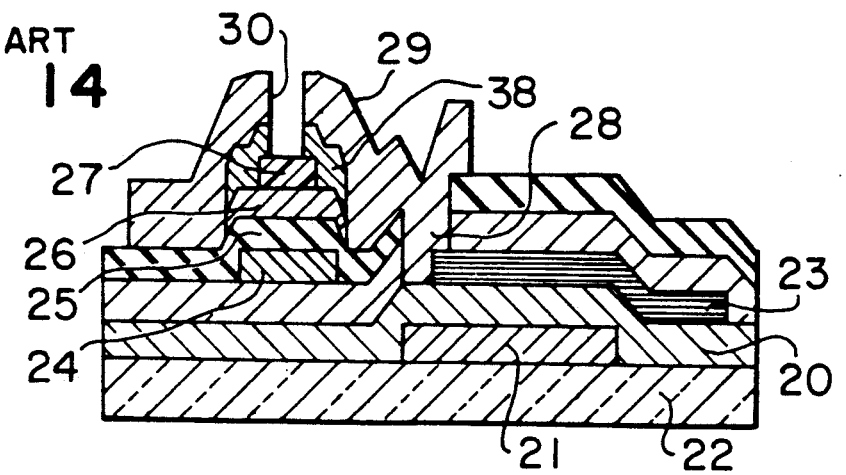

As a next step, a bias was applied to the metallic film 3, which was a TFT gate, and the transparent electrically conductive film 2 positioned thereunder, and while the TFT gate was open, the resulting device was immersed in an electrolyte. And, the n-type semiconductor layer 6 was etched by applying a bias to the source side. FIG. 6 shows an etched portion 9. Acids containing fluoride ions were used as the electrolyte. Depending upon a biased state, the surfaces of the source and drain electrodes 7 and 8 were anodically oxidized, and the n-type semiconductor film 6 was etched while its surface was also oxidized partially. In case of some other biased state and a different electrolyte, the n-type semiconductor film 6 was also completely anodically oxidized to become an insulator. The dimensional accuracy of the printing method in the step 5 was affected by this etching accuracy. However, the bleeding in the printing was decreased in size by anodic oxidation of the surfaces of the source and drain electrodes 7 and 8, and the dimensional accuracy was fairly improved. FIG. 6 schematically shows a liquid crystal display completed by forming a TFT array, then providing a facing plate 10 and forming a liquid crystal layer 11.

The above embodiment has been explained by using, as an example, the process for producing a liquid crystal display panel. However, photoelectric transfer devices using a semiconductor film formed by an alternate current plating method, e.g. a sensitized device and photoelectro-motive device, could be also produced according to a process and device structure similar to those illustrated above.

Further, the TFT has been explained concerning silicon-based materials. However, the above technique was similarly applicable to TFT having a semiconductor layer formed of a germanium-based material, e.g. $GeCl_4$. In this case, propylene glycol was used as a solvent.

The process for producing a thin film semiconductor device, provided by the present invention, does not require the use of even a single mask, nor does it require the use of any vacuum apparatus. Therefore, the process of the present invention can greatly reduce the production cost, and it is industrially valuable to a great extent.

What is claimed is:

1. A process for producing a thin film semiconductor device, said process comprising:
    (a) forming a first electrical conductor on an insulating substrate;
    (b) forming a second electrical conductor on said first electrical conductor by plating;
    (c) insulating a surface of said second electrical conductor;
    (d) forming a semiconductor layer on the insulated second electrical conductor by utilizing an alternating current plating method;
    (e) forming a plurality of third electrical conductors on said semiconductor layer; and
    (f) etching said semiconductor layer by:
        (i) applying a first potential to said first electrical conductor on said insulating substrate in an electrolyte; and
        (ii) applying a second potential identical with or in an opposite direction to said first potential to at least one conductor of said plurality of third electrical conductors in the electrolyte.

2. A process for producing a thin film transistor (TFT), comprising the following steps:
    (a) forming a first transparent conductive film under atmospheric pressure by a printing procedure;
    (b) selectively etching said first transparent conductive film;
    (c) forming a second conductive film on said selectively etched first transparent conductive film by an alternating current plating procedure;
    (d) forming a semiconductor film above said second conductive film by an alternating current plating procedure; and
    (e) insulating at least one portion of said second conductive film or said semiconductor film.

3. A process for producing a thin film transistor (TFT), comprising the following steps:
    (a) forming a first transparent conductive film under atmospheric pressure;
    (b) selectively etching said first transparent conductive film by employing a resist film;
    (c) forming a second conductive film on said selectively etched first transparent conductive film by an alternating current plating procedure;
    (d) forming a semiconductor film above said second conductive film by an alternating current plating procedure; and
    (e) insulating at least one portion of said second conductive film or said semiconductor film.

* * * * *